United States Patent [19]
Fobbester

[11] Patent Number: 5,587,681
[45] Date of Patent: Dec. 24, 1996

[54] DC RESTORATION CIRCUIT

[75] Inventor: Ian G. Fobbester, Gloucestershire, United Kingdom

[73] Assignee: Plessey Semiconductors Limited, United Kingdom

[21] Appl. No.: 324,911

[22] Filed: Oct. 18, 1994

[30] Foreign Application Priority Data

Oct. 29, 1993 [GB] United Kingdom .............. 9322273

[51] Int. Cl.$^6$ .................................................. H03K 5/08
[52] U.S. Cl. ..................... 327/307; 327/306; 327/321; 327/323; 327/180; 327/317; 327/319; 330/11
[58] Field of Search ............................. 327/321, 307, 327/309, 314, 306, 313, 316, 325, 327, 322, 317, 180, 323, 312, 319; 330/11

[56] References Cited

U.S. PATENT DOCUMENTS 4,178,558  12/1979  Nagashima et al. ................. 330/11
4,549,214  10/1985  Hinn ................................... 322/307

FOREIGN PATENT DOCUMENTS 59-135685  8/1984  Japan .
 6196978  7/1994  Japan ................................... 322/302
 1325187  8/1973  United Kingdom .
 9217966  10/1992  WIPO .

Primary Examiner—Timothy P. Callahan
Assistant Examiner—Dinh Le
Attorney, Agent, or Firm—Kirschstein, et al.

[57] ABSTRACT

In a D.C. restoration circuit for a digital FM radio receiver, in which demodulated signals may be presented at the output of the demodulator as low-level differential signals superimposed on a variable D.C. level, the differential signal paths are capacitively coupled to the inputs of a comparator, and the voltage excursions at these inputs are clamped when the voltage between the inputs exceeds a predetermined value.

4 Claims, 2 Drawing Sheets

DC RESTORATION CIRCUIT

BACKGROUND OF THE INVENTION

The present invention relates to D.C. restoration circuits for use, for example, in digital radio receivers.

SUMMARY OF THE INVENTION

According to the present invention a D.C. restoration circuit for digital data signals appearing differentially between first and second input lines, which data signals may be superimposed on a variable D.C. level, comprises first and second series capacitors connected respectively in said first and second lines and first and second clamping transistor circuit means connected respectively on the output sides of said first and second series capacitors each arranged to clamp the voltage excursion at the output side of the respective capacitor when the differential voltage between the first and second input lines exceeds a predetermined value.

The first and second clamping transistor circuit means may each comprise a respective clamping transistor having its emitter-collector path connected between the output sides of said first and second capacitors and a differential amplifier arranged to forward bias the base electrode of the respective clamping transistor when the differential voltage between said lines exceed s said predetermined value in a respective sense.

Alternatively the first and second clamping circuit means may each comprise a respective clamping transistor having its emitter-collector path connected between the output side of the respective capacitor and a voltage supply line of the D.C. restoration circuit.

BRIEF DESCRIPTION OF THE DRAWINGS

A D.C. restoration circuit in accordance with the invention will now be described with reference to the accompanying drawings, of which.

DETAILED DESCRIPTION OF THE PREFERRED EMBODIMENTS

Figure 1:
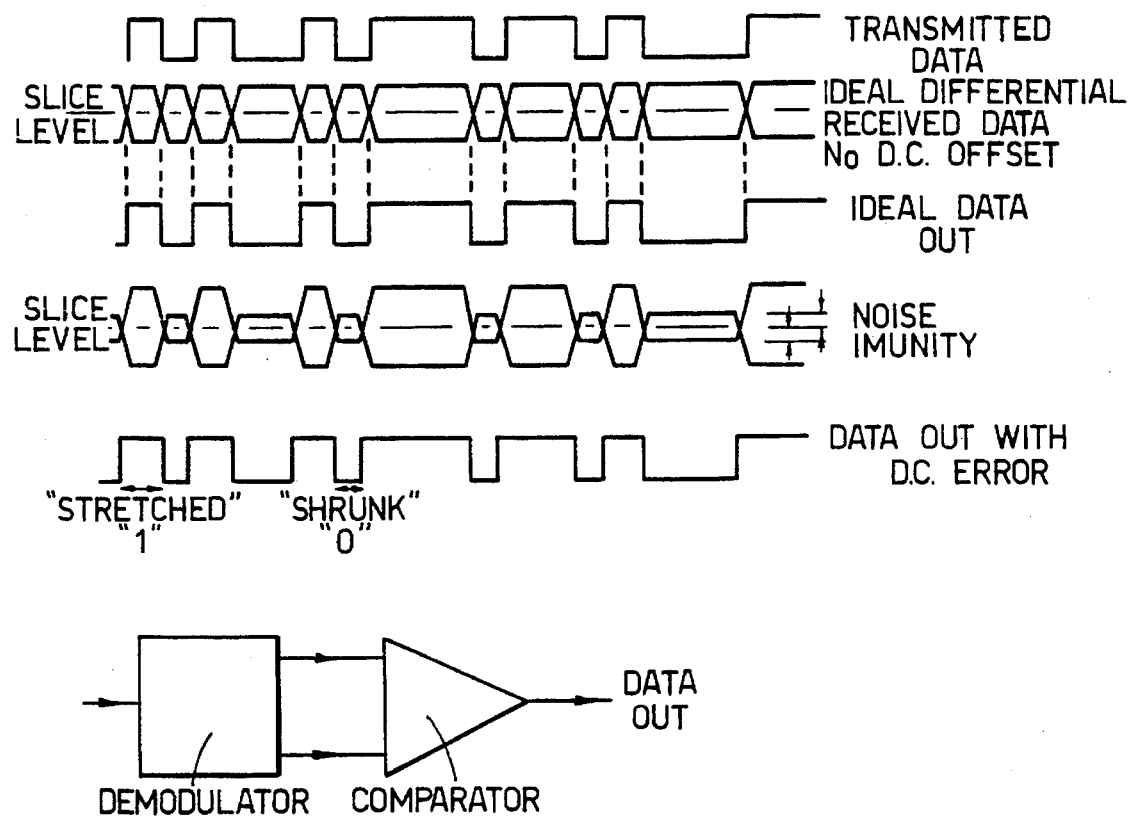
FIGS. 1 and 2 illustrate the operation of known D.C.-coupled and A.C.-coupled data circuits respectively according to the prior art.

Referring to the drawings, in a digital system such as a digital radio, data may exist as a low level signal superimposed on a variable DC level. Such a situation will occur at the output of a quadrature demodulator in a digital FM radio where ideally the demodulator output would be DC coupled to a comparator which would slice the analogue output at the centre of its swing to provide maximum noise immunity and minimum pulse stretching. Because of inevitable frequency errors between the transmitter and receiver the DC level at the output of the demodulator will be unknown since the demodulator has a frequency response to DC. This DC error would cause the comparator to slice the data away from centre, reducing the noise immunity and causing pulse stretching or shrinking. In extreme cases the DC error could be greater than the signal amplitude, producing no output at the comparator output. These effects are shown in FIG. 1.

Figure 2:
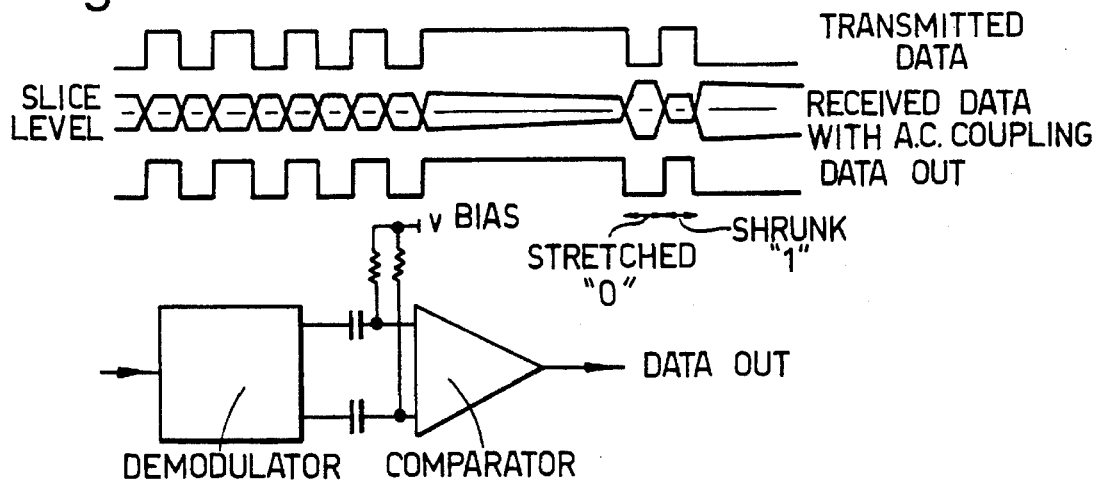

To counter these effects, the obvious solution is to AC couple the signal to the comparator, but AC coupling will also introduce severe pulse stretching because the average level of the signal and therefore the slicing level will depend on the data content. This effect is shown in FIG. 2. A well known method of coping with the variation in DC level caused by AC coupling is to use an adaptive data slice where the positive and negative peaks of the data are peak detected and a slicing level for the data is set at the half way point between these levels. The disadvantage of this system is that the peak detectors must have a fast response time to follow change in the data and a slow decay time to ensure the slicing level is maintained during long strings of similar data bits. In the presence of amplitude noise which may occur on the demodulated signal from a radio system the peak detector will respond to the noise and set an incorrect slicing level until the decay time has elapsed.

Figure 3:
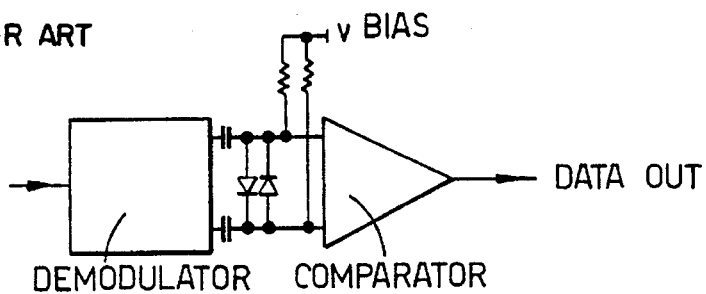
FIG. 3 shows a basic diode clamping circuit according to the prior art.

An alternative method is to use semiconductor diodes to DC restore the signal as shown in FIG. 3, but the forward voltage drop of the diodes must match the amplitude of the analogue signal from the demodulator to work effectively, leaving little option on the amplitude of the signal since the forward voltage drop of diodes is limited to a few fixed values dependent on the manufacturing process. Additionally the soft limiting characteristic of the diodes causes poor DC restoration as conduction takes place over a relatively wide range of voltages.

Figure 4:
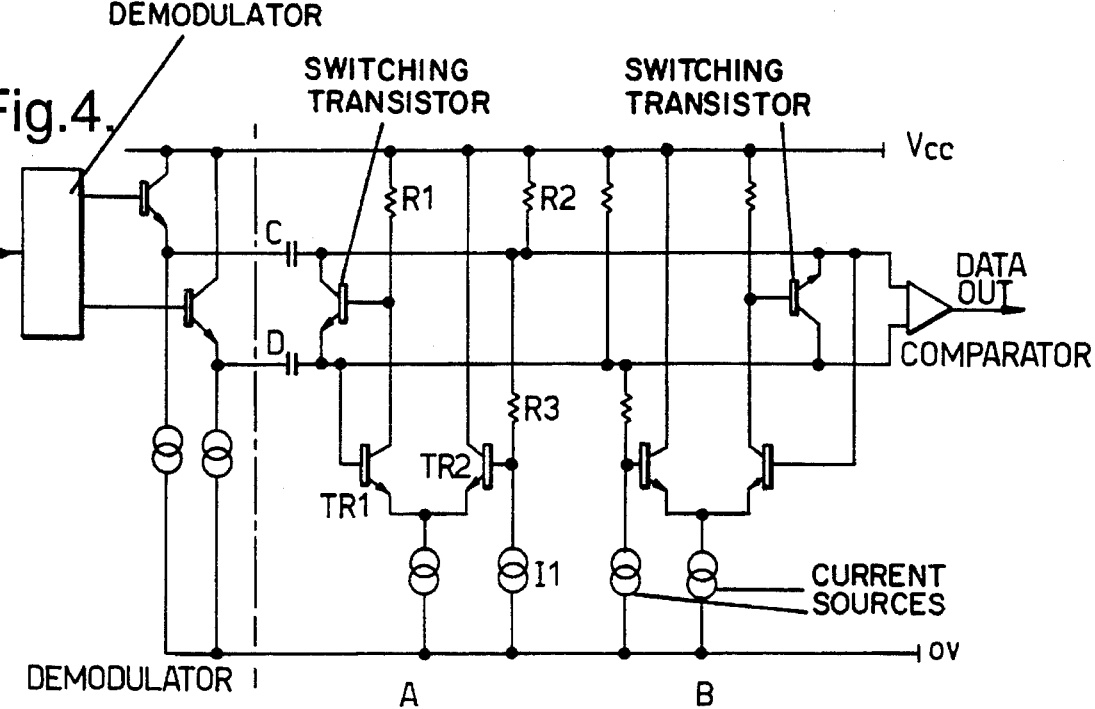
FIG. 4 shows a D.C. restoration circuit in accordance with the invention.

To overcome the disadvantages of these other methods, the circuit shown in FIG. 4 has been developed to provide efficient DC restoration of AC coupled differential signals. The circuit operates in a similar manner to the diode circuit FIG. 3, but the limiting action is hard since the circuit conducts over a more limited range of voltages and the limiting voltage can be controlled accurately over a wide range by changing the value of a pair of current sources or resistors. The circuit is particularly suitable for integration on a bipolar integrated circuit process but could also be fabricated using discrete components.

Figure 5:
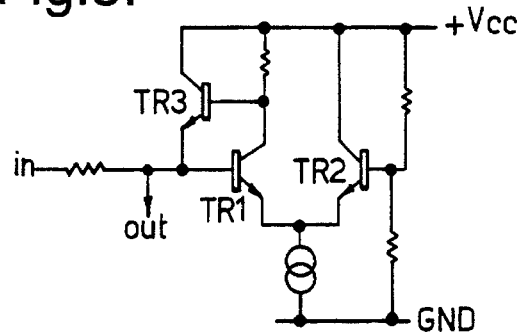
FIG. 5 shows in simplified form an alternative D.C. restoration circuit in accordance with the invention.

The circuit diagram is shown in FIG. 4, and consists of two identical circuits A and B which each provide a clamping action depending on the relative polarity of the differential input signals. Each half of the circuit consists of a long tailed pair with a switching transistor connected between the two lines to be clamped. The circuit operation is best understood by examining the simplified FIG. 5, where the switching transistor collector is connected to the positive supply and the bias resistors to the long tailed pair are disconnected from the input signal. With the circuit configured in this way, the circuit has a low impedance when the base of TR1 is taken more negative than the base of TR2 since TR1 will turn off allowing the collector load resistor R1 to turn on the switching transistor TR3 to prevent the base of TR1 going more negative. When the base of TR1 is taken more positive than the base of TR2, TR1 will turn on but the base emitter junction of TR3 will be effectively biased off. As can be seen from this description, the circuit behaves in the manner of an ideal diode to signals crossing the reference voltage set on TR2 base. The range of input voltage to switch the circuit from non conducting to conducting can be controlled by adjusting the voltage gain of the long tailed pair.

Returning to the original circuit, the base of TR2 is connected to a potentiometer formed by resistors R2 and R3 fed from a current source I1. The current forces a constant voltage drop across R3 regardless of the voltage produced by the input signal C on the junction of R2 and R3 and therefore the base of TR2 follows the signal C but with a constant negative DC level shift. If the voltage drop in R3 is made equal to the peak to peak amplitude of the data, the signal on input D will be clamped when the voltage goes more negative than that on TR2 base or more importantly, more than the peak amplitude of the signal more negative than the signal on line C. By connecting the switching transistor across the two inputs C and D the circuit clamps the differential voltage to the peak signal amplitude in the manner of a perfect diode. A pair of these circuits connected as shown in FIG. 4 with cross coupled inputs will behave in a similar manner to two back to back diodes as shown in FIG. 3.

When the voltage swing of the input signal is small there is a danger that the switching transistor could saturate and adversely affect circuit operation. To overcome this problem, a modification to the circuit is possible where the collectors of the switching transistors are connected to VCC instead of to the input signal lines in this form the circuit only provides a charging current to each capacitor when it is the most negative input and both lines to the comparator will change average level dependent on the dam content. The average level shift will appear as common mode to the comparator and will not affect circuit operation.

I claim:

1. A D.C. restoration circuit for digital data signals appearing differentially between first and second input lines, said data signals being superimposed on a variable D.C. level, comprising: first and second capacitors; means for connecting said first capacitor between said first input line and a first output of said D.C. restoration circuit; means for connecting said second capacitor between said second input line and a second output of said D.C. restoration circuit; first and second switching transistors each having emitter, base and collector electrodes; means for connecting the emitter electrode and the collector electrode of said first switching transistor to said first output and to said second output respectively; means for connecting the emitter electrode and the collector electrode of said second switching transistor to said second output and to said first output, respectively; and means responsive to signal voltages at said first and second outputs to forward bias the base electrodes of said first and second switching transistors with respect to their respective emitter electrodes when the signal voltages at said first and second outputs exceed respective predetermined values.

2. A D.C. restoration circuit in accordance with claim 1, wherein said means responsive to signal voltages at said first and second outputs comprises first and second longtail pairs of transistors, each transistor having emitter, base and collector electrodes, the emitter electrodes of each pair of transistors being connected together and to a respective current source, the base electrodes of one transistor of each pair being connected to a respective one of said first and second outputs, the base electrodes of the other transistor of each pair being connected to a source of reference potential, and the collector electrode of one transistor of each pair being connected to the base electrode of a respective one of said first and second switching transistors.

3. A D.C. restoration circuit for digital data signals appearing differentially between first and second input lines, said data signals being superimposed on a variable D.C. level, comprising: first and second energizing supply lines; first and second capacitors; means for connecting said first capacitor between said first input line and a first output of said D.C. restoration circuit; means for connecting said second capacitor between said second input line and a second output of said D.C. restoration circuit; first and second switching transistors each having emitter, base and collector electrodes; means for connecting the emitter electrode of said first switching transistor to said first output; means for connecting the emitter electrode of said second switching transistor to said second output; means for connecting the collector electrodes of each of said first and second switching transistors to one of said first and second energizing supply lines; and means responsive to signal voltages at said first and second outputs to forward bias the base electrodes of said first and second switching transistors with respect to their respective emitter electrodes when the signal voltages at said first and second outputs exceed respective predetermined values.

4. A D.C. restoration circuit in accordance with claim 3, wherein said means responsive to signal voltages at said first and second outputs comprises first and second longtail pairs of transistors, each transistor having emitter, base and collector electrodes, the emitter electrodes of each pair of transistors being connected together and to a respective current source, the base electrodes of one transistor of each pair being connected to a respective one of said first and second outputs, the base electrodes of the other transistor of each pair being connected to a source of reference potential, and the collector electrode of one transistor of each pair being connected to the base electrode of a respective one of said first and second switching transistors.

\* \* \* \* \*